United States Patent
Van Der Valk et al.

[11] Patent Number: 5,905,388
[45] Date of Patent: May 18, 1999

[54] FREQUENCY SYNTHESIZER

[75] Inventors: Robertus L. Van Der Valk, Dordrecht; Robertus J. Dequesnoy, Spijkenisse; Johannes H. A. De Rijk, 'S-Hertogenbosch; Menno T. Spijker, Rotterdam, all of Netherlands

[73] Assignee: X Integrated Circuits B.V., Rotterdam, Netherlands

[21] Appl. No.: 08/860,670

[22] PCT Filed: Jan. 8, 1996

[86] PCT No.: PCT/NL96/00013

§ 371 Date: Sep. 26, 1997

§ 102(e) Date: Sep. 26, 1997

[87] PCT Pub. No.: WO96/21279

PCT Pub. Date: Jul. 11, 1996

[30] Foreign Application Priority Data

Jan. 6, 1995 [NL] Netherlands ............... 9500034

[51] Int. Cl.$^6$ ............... H03B 21/00; H03L 7/06; G06F 1/16
[52] U.S. Cl. ............. 327/107; 327/159; 364/718.02
[58] Field of Search ............... 327/156, 159, 327/105, 107; 375/376; 331/18, 25; 364/718.02

[56] References Cited

U.S. PATENT DOCUMENTS

| | | | |
|---|---|---|---|
| 4,185,247 | 1/1980 | Harrison, Jr. | 328/165 |
| 4,746,880 | 5/1988 | McCune, Jr. | 332/16 R |
| 5,552,727 | 9/1996 | Nakao | 327/159 |
| 5,708,687 | 1/1998 | Powell et al. | 375/376 |

FOREIGN PATENT DOCUMENTS

| | | |
|---|---|---|
| 0630129 | 12/1994 | European Pat. Off. . |
| 2690794 | 11/1993 | France . |
| 1447418 | 8/1976 | United Kingdom . |
| 2247368 | 2/1992 | United Kingdom . |

OTHER PUBLICATIONS

Proceedings of the 40th Annual Frequency Control Symposium, 1986 (CAT. No. 86CH2330–9), pp. 355–365.
Proceedings of the 40th Annual Frequency Control Symposium, 1986 (CAT. No. 86CH2330–9), pp. 373–378.
Patent Abstracts of Japan, vol. 16, No. 389, Aug. 1992.

*Primary Examiner*—Kenneth B. Wells
*Assistant Examiner*—Hai L. Nguyen
*Attorney, Agent, or Firm*—Banner & Witcoff, Ltd.

[57] ABSTRACT

The invention relates to a circuit for frequency synthesis, comprising: a digital controlled oscillator, comprising (a) a clock generator; an accumulator circuit to which the signal from the clock generator is fed; and a control digit feed circuit for feeding to the digital oscillator a signal representing a control digit; and (b) a phase-locked loop which is connected to the carry output terminal of the accumulator circuit and which is provided with a phase detector, a low-pass filter and a controlled oscillator, wherein the carry output terminal is connected to the phase detector. The digital controlled oscillator is preferable adapted to generate a signal representing a remainder, wherein a correction circuit is arranged for deriving a correction signal from the remainder. The correction circuit is connected to a combination circuit connected to one of the inputs of the phase detector or to a combination circuit incorporated in the phase-locked loop. The circuits can also be connected in cascade.

12 Claims, 3 Drawing Sheets

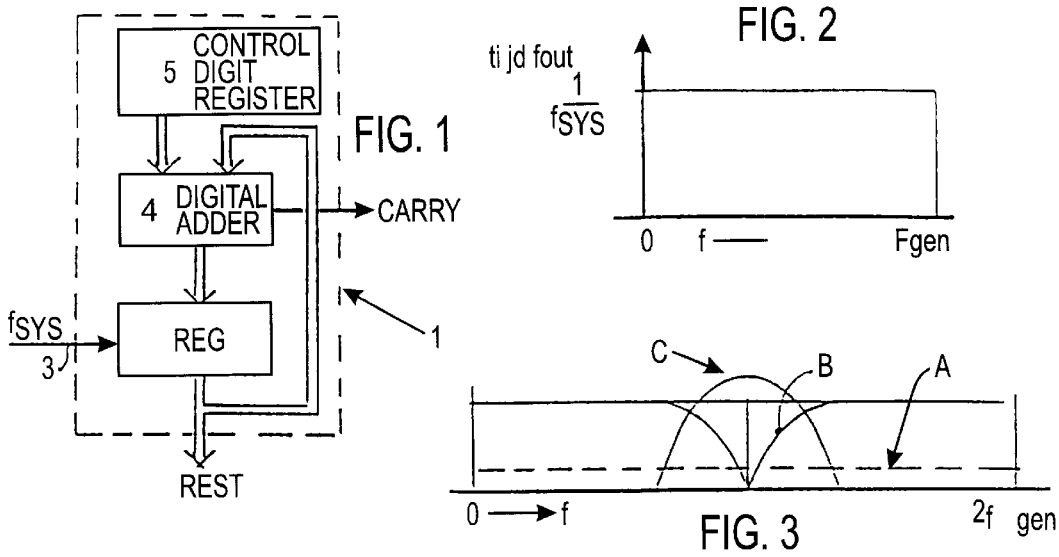
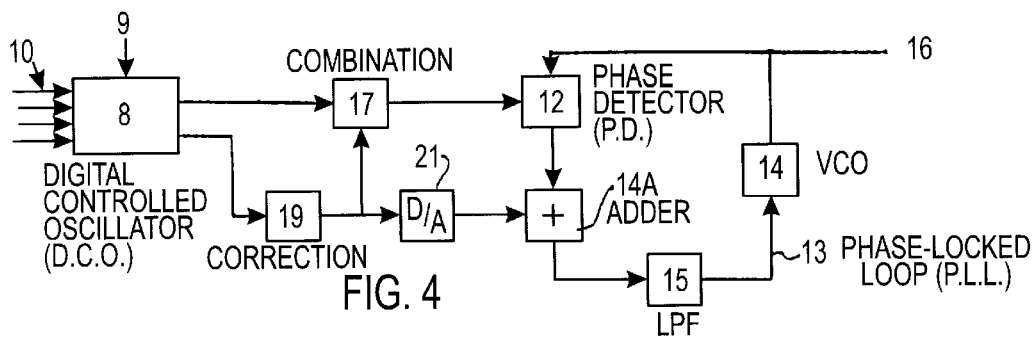
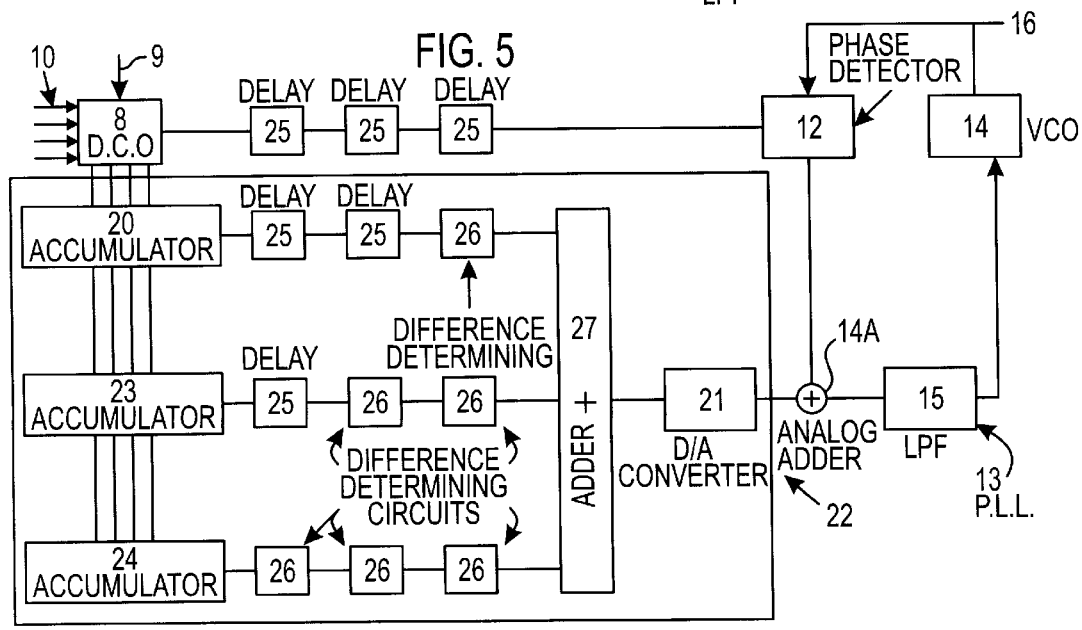

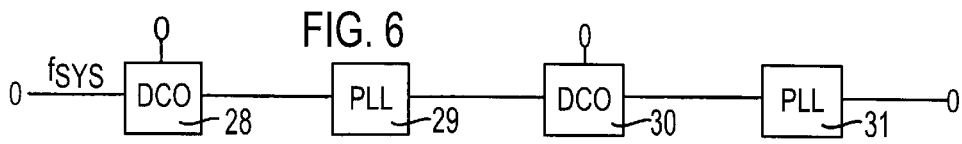
FIG. 6
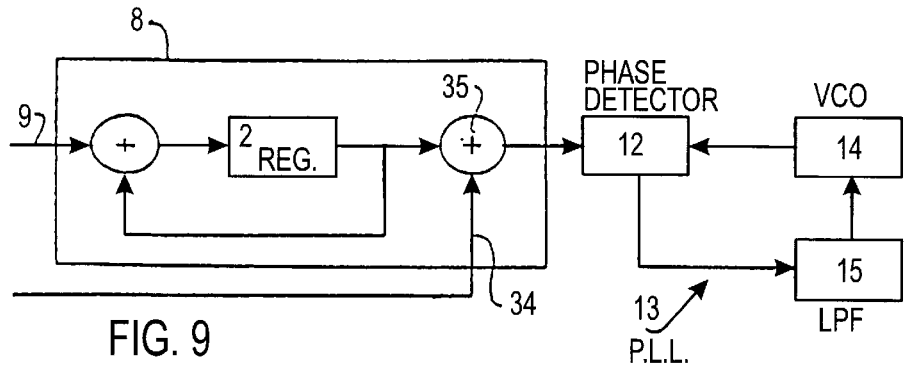
FIG. 9
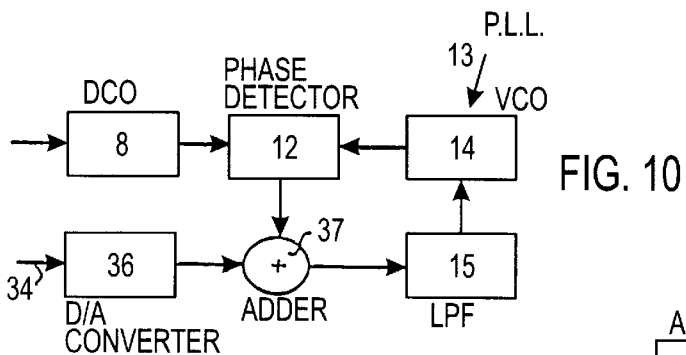
FIG. 10
FIG. 11
$$\cos(\omega_c t + \varphi)$$
$$m(t) \cdot \cos(\omega_c t)$$
$$\cos(\omega_c t - \varphi)$$
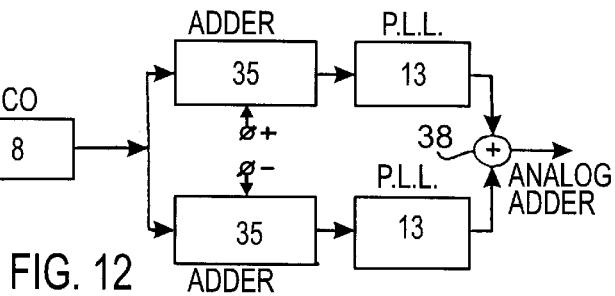
FIG. 12
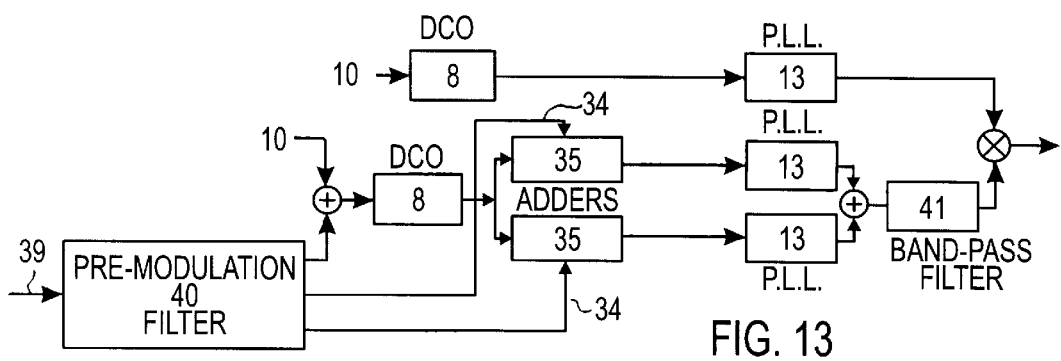
FIG. 13

FREQUENCY SYNTHESIZER

The application relates to a circuit for frequency synthesis.

Such circuits are generally known. Frequency synthesizers are thus known which comprise a digital controlled oscillator followed by a filter. When the digital controlled oscillator is adapted for generating more than one frequency, the relevant filter must of course be a tracking filter. Such so-called tracking filters are expensive and bulky.

Such prior art circuits are moreover only suitable for large frequency steps. Nor are they suitable for integration into a modulator.

The object of the present invention is to provide a circuit for frequency synthesis wherein the above mentioned drawbacks are avoided.

This object is achieved by such a circuit which is characterized by:
  a digital controlled oscillator, comprising:
    a clock generator;
    an adder circuit to which the signal from the clock generator is fed; and
    a control digit feed circuit for feeding a signal representing a control digit to the adder circuit; and
  a phase-locked loop which is connected to the carry output terminal of the adder circuit and which is provided with a phase detector, a low-pass filter and a controlled oscillator, wherein the carry output terminal is connected to the phase detector. It is noted here that in the literature such a digital oscillator is also known as a fractional rate multiplier, digital controlled oscillator, or as accumulator circuit. The frequency of the output signal, the carry signal, satisfies the following formula:

$$f_{carry} = f_{sys} \cdot \frac{N_i}{N_{max}}$$

wherein:
  $N_{max}$—is the largest number which can occur in the adder circuit;
  $N_i$—is the control digit;
  $f_{sys}$—is the system frequency;
  $f_{carry}$—is the frequency of the carry signal.

Although a circuit according to the above mentioned claims can easily be embodied in integrated form and no tracking filter is necessary due to the use of a PLL, the wave shape is found to be not entirely optimal. This is due to the fact that—as a result of the operation of the digital controlled oscillator—the frequency of the output signal is not regular.

The adder circuit is adapted to generate a remainder-representing signal. Preferably arranged is a correction circuit for deriving a correction signal from this remainder. According to a first embodiment an output terminal of the correction circuit is connected to a combination circuit which is connected to the input terminals of the phase detector.

The results are however improved even more when the correction circuit comprises three controlled accumulators and a D/A converter.

The very best results are however obtained only when the correction circuit comprises N digital controlled accumulator circuits, wherein each of the accumulators is adapted to receive the remainder of the preceding accumulator and each of the accumulators is connected via a plurality of difference determining circuits equal to its order number—1 to an adder circuit, the output terminal of which is connected to the D/A converter.

The above described frequency synthesizer is suitable for generating a sine-shaped signal, a saw-tooth signal, a square wave signal or other type of signal of which the frequency is externally controlled, for instance for generating a signal for use in measuring equipment or in modulators and/or demodulators.

In such an application it is therefore attractive to integrate the modulation process or the demodulation process in the circuit. It is assumed here that by the term "modulate" in the accompanying claims is also understood demodulate; both after all comprise making a non-linear combination of the signal for processing with a carrier wave signal.

The circuit according to the invention can be used in frequency or phase modulation and even in amplitude modulation. In this latter case a combination is made of two or more phase modulators. It is of course possible to use the circuit according to the invention in a combination of frequency or phase modulation with amplitude modulation.

The invention will be further elucidated hereinbelow with reference to the annexed drawings, wherein:

FIG. 1 shows a diagram explaining the operation of a digital controlled oscillator;

FIG. 2 shows a phase spectrum of the signal generated by the digital controlled oscillator;

FIG. 3 shows a frequency spectrum of the signal generated by the digital controlled oscillator;

FIG. 4 shows a diagram of a first embodiment of a circuit according to the invention;

FIG. 5 shows a diagram of a second embodiment of a circuit according to the invention;

FIG. 6 shows a circuit according to the invention which produces a signal with a better quality through the choice of control digits and ratios;

FIG. 9 shows another embodiment of a diagram which is suitable for phase or frequency modulation;

FIG. 10 shows a diagram of a circuit according to the invention adapted for phase modulation;

FIG. 11 shows a phaser diagram to elucidate the principle of the circuits for amplitude modulation shown in FIG. 12;

FIG. 12 shows a diagram of a circuit according to the invention suitable for amplitude modulation; and FIG. 13 shows a diagram of a circuit according to another embodiment according to the invention, with which multiple modulation is possible.

Figure 7:
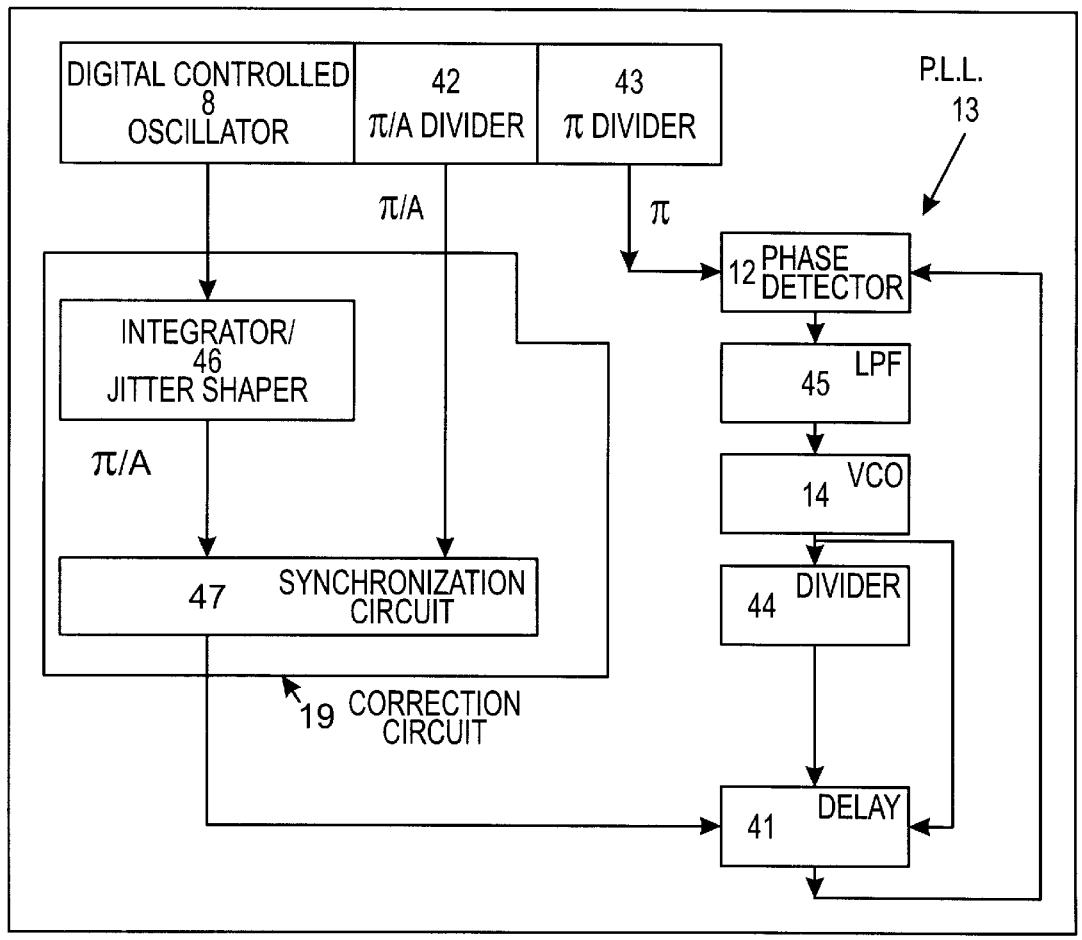
FIG. 7 shows a circuit according to a third embodiment of the invention.

For an understanding of the present invention it is important to understand the operation of a digital controlled oscillator. The circuit and the operation of a digital controlled oscillator is thus first elucidated with reference to FIG. 1.

The digital controlled oscillator 1 shown in FIG. 1 is formed by a register 2 to which a clock signal with the frequency $f_{sys}$ is supplied via a clock signal line 3. The register is connected on its input side to a digital adder circuit 4, while the likewise parallel output terminal of the register is connected to one of the two input terminals of adder circuit 4. Connected to the other input terminal of adder circuit 4 is a control digit register circuit 5. The output terminal of the register is also embodied separately. It is of course also possible to vary the content of the control digit register 5 from outside. In the wording of the claims the combination of adder circuit and register is referred to as accumulator.

The operation of this control digit circuit is as follows: in the adder circuit 4 the content of the control digit register 5 is added to the content of the register prior to the preceding clock cycle. The result of this addition is fed to the register 2. This addition is herein performed modulo a determined number. This determined number will correspond to the maximum content of the register, in general thus a power of 2. Thus, for each addition which exceeds this power of two, for instance 8, a carry signal results which essentially forms the output signal of the digital controlled oscillator. Only when in the result of an addition the maximum content is not reached is no carry signal generated. Thus, in the case the dividend is 7 and the maximum content of the register is 8, a carry signal is generated seven of the eight times a clock pulse is supplied.

It will be apparent that the thus obtained output signal is subject to serious phase errors. Expressed in time these phase errors lie in the range between 0 and $1/f_{sys}$. The starting point here is the situation where the reference level lies at a limit of the range over which the phase errors are distributed; it is likewise possible to place the reference point in the middle of this range and to let it extend to both sides. The maximum phase error is then of course a factor of 2 smaller, but this can be positive as well as negative.

This is all shown in FIG. 2. The output signal is therefore affected by a phase error and it is possible to depict this phase error in the frequency range. This results in FIG. 3.

In FIG. 3 the rectangular characteristic shows the distribution of the frequency of the digital oscillator. It can be seen here that these frequencies extend between 0 and twice the generator frequency. Little can be said however about the distribution hereof. The drawing is therefore limited to a uniform distribution. The object is of course to generate only the actual target frequency, $F_{gen}$. There are in principle three possible ways of doing this:

A) lowering all frequencies except for the desired frequency,

B) suppressing the frequencies around $f_{gen}$ in the direct vicinity hereof; further operation can then take place with a filter, C) a priori only generating the desired frequency.

The resulting frequency spectra are designated with A respectively B in FIG. 3.

A first embodiment of the invention will now be shown with reference to FIG. 4, which embodiment follows the strategy designated under "A" above.

The circuit is formed by a digital controlled oscillator 8 to which a clock signal is fed via a clock signal line 9 and to which via N parallel lines 10 a control digit is fed in digital form. The digital controlled oscillator has two output terminals. At a first output terminal a digital signal becomes available, the frequency of which is the same as the frequency presented by the control digit.

This signal is fed via a combination circuit 17 to a phase detector 12 which forms part of a phase-locked loop 13. The phase-locked loop comprises a voltage-controlled oscillator 14 and a low-pass filter 15. It is noted here that under voltage-controlled oscillators are also understood current-controlled oscillators. The output signal of the phase detector is fed to the low-pass filter 15, the output signal of which controls the voltage-controlled oscillator 14. The output signal of the voltage-controlled oscillator 14 becomes available at an output terminal 16 and is also fed to a second input terminal of the phase detector 12. Further arranged between the phase detector and the low-pass filter is the analog adder circuit 14a.

The digital controlled oscillator is further provided with a second output terminal at which the remainder of the addition performed by the digital controlled oscillator is available. This remainder is fed to a correction circuit 19, the output terminal of which is connected to a combination circuit 17.

The operation of the circuit will be explained hereinbelow.

The digital controlled oscillator acts initially as an adder. The clock signal 9 coming from a crystal oscillator not shown in the diagram is added by the digital adder circuit 4 in the digital controlled oscillator 8, wherein, in order to bring about optimum operation of the oscillator, the counting preferably takes place until an "ugly" number is obtained. By an "ugly" control digit is understood a control digit which, when divided by the overflow number, produces a poorly divisible fraction; in other words, that as few factors as possible occur in common in both numbers. Reference is otherwise made herein to the formula on page 2. This will result in a ratio between the frequency of the output signal of the voltage-controlled oscillator and the clock signal fed thereto, wherein as few components of the clock signal as possible are to be found in the output signal, which is of the utmost importance for further processing of the signal.

The output signal is fed to the phase-locked loop which removes possibly remaining unwanted frequency components.

This is related to the fact that the output signal of the digital controlled oscillator is a square wave, which, as a result of the operation of the digital oscillator, is not entirely regular, so that this square wave comprises a high percentage of undesired, non-harmonic components which must of course be filtered out. This filtering takes place by means of a phase-locked loop.

The output signal of the phase-locked loop is therefore substantially sine-shaped or of other shape without further components.

The correction circuit 19 therefore has as its most important function to correct the phase of the output signal by using as correction term the remainder present on the digital controlled oscillator 8. A D/A converter 21 is of course necessary for this purpose, since the remainder is a digital form and the phase-locked loop is a circuit with analog operation.

According to an embodiment not shown in the drawings a divider circuit is arranged between the voltage-controlled oscillator and the phase detector. The use of the described divider circuit creates the possibility of reducing the time error. When the divider circuit has a divider M, time resolution can be improved by a factor M. A shift register-like circuit is herein used which in fact forms an implementation of the combination circuit 17. The shift register-like construction can be clocked with a multiple of the system frequency or with the frequency generated by the voltage-controlled oscillator or with a signal derived from said frequency with a divider. Use can also be made of an oscillator of which the system clock is derived from a divider circuit. The resolution is then $F_{sys}/M$, herein $T_{sys} = 1/f_{sys}$.

FIG. 5 shows a second embodiment of the frequency synthesizer according to the invention wherein the correction circuit has a different configuration. In the figure only the analog adder circuit 14a is designated, while the combination circuit 17 (not shown) can also be used, either in combination or not. This is the configuration according to model B in FIG. 3.

The correction circuit 22 according to this second embodiment comprises a digital accumulator 20 followed by a second digital accumulator 23 and a third digital accumulator 24. In terms of circuitry the accumulators correspond with the digital controlled oscillators. The accumulators are mutually connected herein by means of their remainder terminals. The carry terminal of the second accumulator is connected via two delay circuits 25 to a difference determining circuit 26. The third digital accumulator 23 comprises a carry terminal which is connected via a delay circuit 25 and two difference determining circuits 26 to a digital adder circuit 27. Finally, the carry terminal of the fourth digital accumulator 24 is connected to adder circuit 27 via three difference determining circuits 26.

The output terminal of adder circuit 27 is connected to D/A converter 21.

This circuit further differs from the circuit shown in FIG. 4 in that three delay circuits 25 are arranged between the digital controlled oscillator 8 and the phase detector 12 of the phase-locked loop 13. These circuits are of course provided with clock terminals (not shown in the drawing) for synchronization purposes.

The operation of this circuit differs relative to the circuit shown in FIG. 1 in that the approximation of the correction term supplied to the phase-locked loop is three orders of magnitude better. In the phase domain this amounts to a drop of 20 dB/decade per accumulator. This will of course result in a better frequency stabilization. It will be apparent that it is possible to change the number of digital accumulators in the correction circuit, for instance by only using two. In that case one of the delay circuits 25 connected to the digital accumulator 20 is omitted, as is the delay circuit 25 connected to the digital accumulator 23 and one of the delay circuits connected between the first digital controlled oscillator 8 and the phase detector 12. Of course it is also possible to increase the number of digital accumulators to make the approximation more accurate. All these embodiments fall within the scope of the present invention even though they are not shown in the drawings. The choice of which depends on the accuracy the output signal is required to satisfy.

It is possible to employ a configuration wherein the correction signal comprises two parts which each process a part of the remainder and one of which adds a first correction signal to the signal from the digital oscillator and the second supplies a second correction signal to the phase-locked loop. (Such a configuration is a combination of the models A and B).

Shown in FIG. 6 is another embodiment which falls under the designation C in FIG. 3. Herein two combinations, each of a digital controlled oscillator and a phase-locked loop, are connected in cascade. Each of the digital controlled oscillators is provided with a control digit input terminal. It is of course possible to connect in cascade more than two of such combinations. It is of course possible to freely select the divisions of the digital controlled oscillators which perform the frequency division. The first digital controlled oscillator 28 changes the $f_{sys}$ which is presented at its input terminal by a factor as according to the formula on page 2, wherein the first PLL only allows through signals located in the direct vicinity of the frequency of $f_{sys}$ times the divider of the first digital controlled oscillator. By again using the combination of a digital controlled oscillator and a phase-locked loop an improvement in the thus obtained signal is achieved in respect of phase purity and frequency. This provides a large number of degrees of freedom, wherein it is noted that, particularly when control digits are used which are related to each other as little as possible, a signal is obtained which is as "clean" as possible. According to this embodiment an oscillator is thus obtained of which the frequency is freely adjustable and of which the quality of the output signal is high.

Shown in FIG. 7 is a third embodiment with which an even better freedom from jitter can be obtained.

As in the foregoing embodiments, this circuit comprises a controlled oscillator, which in this embodiment is formed by three blocks 8, 42 and 43 and a phase-locked loop which is designated in its entirety by 13. The output terminal of block 8 is also connected to a correction circuit 19 which is connected to the phase-locked loop 13. However, in contrast to the foregoing embodiment, correction circuit 19 is connected to a delay circuit 41 which is incorporated in the phase-locked loop and which can take the form of a frequency divider. The phase-locked loop also includes at least one divider (44) arranged between the voltage-controlled oscillator and the delay circuit. The output terminal of this divider is directly connected to a clock terminal of the delay circuit.

The digital controlled oscillator is thus formed by three parts. This is comparable to for instance a prior art 1000-counter; this can be defined as a 10-divider concatenated with a 100-divider. It is thus also possible to combine for instance hexadecimal and decimal numbers, such as a number that consists of two hexadecimal and three decimal positions. The three decimal positions may be taken together and then obtain a "MOD 1000" operation. The two hexadecimal positions together obtain a "MOD 256" operation.

The digital controlled oscillator is also split in this manner; a block 8 which indicates a remainder, a block 43 which indicates a number of times π (or 180°) and a block 42 which indicates a number of times π/A.

In order to bring about good concatenation this latter block performs a modulo A operation; A pieces of π/A equals π, i.e. block 43 is increased by 1 if the modulo operation has sufficient space. In short, 8, 42 and 43 together form the digital controlled oscillator.

Block 42 has a content of which the value is always smaller than A. It can thus be stated that if the value of the π-signal of block 43 changes at the flank of the clock signal, the remainder in block 42 indicates what the error is, expressed in pieces π/A. If now the PLL generates a frequency which is A times as high as the reference signal from block 43, this frequency, expressed in time per cycle, thus equals π/A. The unit of an RF cycle and the remainder has thereby become identical; this is useful for reducing the error in the time, which was initially a maximum of one system cycle, to one oscillator cycle. The voltage-controlled oscillator or VCO will thus generate a much higher frequency than the system clock signal, which is of course attractive.

The use of the RF clock signal itself is quite simple; the partial remainder in block 42 (the rest of the remainder is in block 8) indicates, expressed in one numeral, the number of full VCO cycles in which the reference comes too late relative to the divided down VCO clock signal. By now delaying the divided down VCO clock signal by the same number of cycles, the remaining error becomes significantly smaller, i.e. as small as the VCO clock signal.

The remaining remainder in block 8 now indicates in a fraction of the RF cycle that there is still a residual error. The jitter caused by this error can be decreased with an integrator or jitter shaper 46 and can then be combined in the synchronization circuit 47 with the signal from block 42 and be added to the delay circuit 41. The jitter shaper 46 thus ensures that the maximum phase error of one VCO cycle can be suppressed using the averaging of the phase error through time. This is an important suppression function of the PLL.

The use of a variable A for the modulo operation and the dividing operation results in an additional degree of freedom which can be chosen by causing the digital oscillator to generate an "ugly" frequency. An example: say that the VCO is supposed to generate a frequency of 320.1 MHz and that the applied system frequency is 20 MHz. It is then extremely irritating to have A equal for instance 64 and to have to generate about 5 MHz (320/64) in the digital oscillator. The ratio of 5 to 20 MHz is then too much of a whole number, so that rather a lot of low frequency jitter remains. Instead we choose for instance 54 for A, so that we must generate 320.1/54 equals 5.92 MHz. This produces much more high frequency jitter which is much easier to eliminate.

It will be apparent that by using a division by A in the phase-locked loop 13 as well as in the digital part of the oscillator a sampling process is supplied at another frequency, which of course has a favourable effect on the stability and thus on freedom from jitter.

In accordance with a non-essential but attractive embodiment, a low-pass filter 45 is connected between the phase detector and the voltage-controlled oscillator, as is typical in phase-locked loops.

The above embodiments are essentially suitable for generating a signal with a constant frequency. It is of course possible to use the circuits for generating modulated signals.

Figure 8:
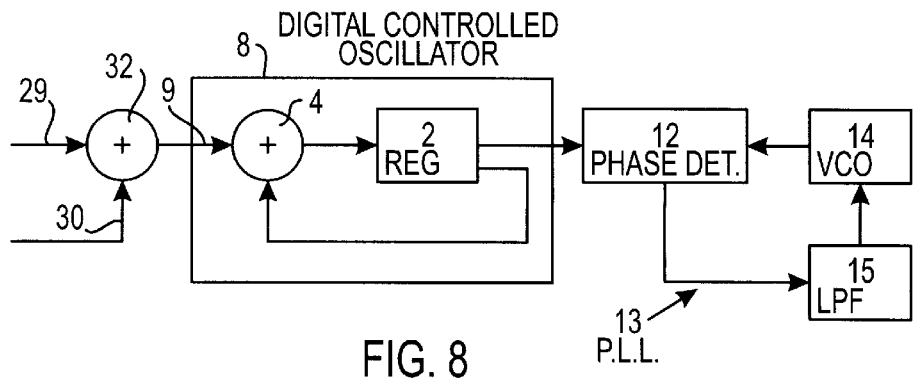
FIG. 8 shows a circuit according to the invention which is adapted for phase or frequency modulation.

An embodiment hereof is shown in FIG. 8. A signal representing the carrier wave frequency is herein supplied to a digital adder circuit 32 via the connection 29 and the modulating frequency or the digital signal representing the modulating phase is supplied via a connection 30. The two signals are added together in the adder circuit 32 and fed to the digital controlled oscillator 8 as control digit. It will be apparent without much explanation that this circuit can be used to generate a frequency-modulated signal or a phase-modulated signal. With the circuit the phase and the frequency of the generated signal can be extremely accurate and are only limited by the technology used.

In the embodiment shown in FIG. 9 an adder circuit 35 is arranged between the digital controlled oscillator 8 and the phase-locked loop 13. In this adder circuit the digital controlled oscillator 8 is used to generate the carrier wave signal in digital form, wherein the modulating signal supplied via the connection 34 is added to the carrier wave signal in adder 35 and subsequently fed to the phase-locked loop 13. This circuit can also be used for both phase and frequency modulation.

FIG. 10 shows an embodiment wherein the modulating signal 34 is supplied to a D/A converter 36 and the signal is subsequently used in analog form for addition to the signal circulating in the phase-locked loop 13. Use is herein made of an adder circuit 37 incorporated in the phase-locked loop 13. It will be apparent that this latter embodiment can only be used for phase modulation. It is however possible to add the signal to other positions in the phase-locked loop, for instance to the signal between voltage-controlled oscillator 14 and phase detector 12.

The above described embodiments relate to phase or frequency modulation of a carrier wave. It is possible to produce amplitude modulated signals by combining phase modulated signals.

This will be clarified with reference to FIG. 11, wherein phasers are shown which each represent a phase-modulated signal and wherein the phase of both signals is opposed and which, when added together, result in an amplitude-modulated signal. When this is applied in practice there results for instance a circuit as shown in FIG. 12. Use is herein made of the phase modulation circuit shown in FIG. 9, wherein two such circuits are arranged which are each supplied with a modulating signal in opposed phase.

The digital controlled oscillator of both circuits can of course be combined and it is necessary to add together the output signal of the two circuits. Use is herein made of an analog adder circuit 38. This can be formed for instance by an adder circuit provided with resistors. This is however not a particularly attractive option, since resistors are difficult to embody in integrated form and they have a high dissipation, which is less desirable particularly in battery-powered appliances. It is further possible to make use of a transformer, which is also difficult to implement in integrated form and which has a number of limitations in the frequency range. Another possibility is to make use of so-called patch radiators, particularly when using high frequencies. The use of three or more phase modulators to generate an amplitude-modulated signal has the advantage of ensuring that amplitude 0 can be generated. When two phase-modulated signals with differing amplitudes are added together, the amplitude of the resulting signal can never be made 0.

Finally, FIG. 13 shows an embodiment of a circuit for generating modulated signals which is suitable for generating signals which are phase- or frequency-modulated and amplitude-modulated. Use is made herein of a so-called pre-modulation filter which derives signals from the modulating signal supplied to pre-modulation filter 40 via terminal 39, which signals are suitable for frequency modulation and phase modulation, wherein the phase modulating signals can be used for amplitude modulation. This circuit corresponds with the circuit shown in FIG. 12 with the exception of the use of a band-pass filter 41 which is used in this embodiment because the thus modulated signal is converted in frequency. The band-pass filter is necessary to prevent the modulation from being influenced by the conversion.

For a specific application methods A, B and C can be used both alone and in combination. The degree to which a method is used depends on the available technology and the set requirements. The correct combination of methods as well as the contribution of the method can be found by means of an optimization procedure.

It will be apparent that various modifications can be made to the circuit according to the present invention without deviating from the invention.

We claim:

1. A circuit, including one or more circuits for frequency synthesis, at least one of said circuits for frequency synthesis comprising:
   a first controlled oscillator which is digitally controlled and adapted to generate a signal representing a remainder, comprising:
      a clock generator;
      an accumulator circuit to which the signal from the clock generator is fed; and
      a control digit feed circuit for feeding to the accumulator circuit a signal representing a control digit;
   a phase-locked loop which is connected, via a combination circuit, to a carry output terminal of the accumulator circuit and which is provided with a phase detector, a low-pass filter incorporated in the phase-locked loop after the phase detector, and a second controlled oscillator incorporated in the phase-locked loop after the low pass filter and before the phase detector, wherein the carry output terminal is connected to the phase detector via said combination circuit; and
   a correction circuit for deriving a correction signal from the signal representing a remainder
   characterized in that an output terminal of the correction circuit is connected to said combination circuit which is connected to an input terminal of the phase detector.

2. Circuit as claimed in claim 1, characterized in that the output of the correction circuit is connected to a D/A-converter, and the output of the D/A-converter is also connected to an adder circuit (14a) incorporated in the PLL after the phase detector.

3. Circuit as claimed in claim 2, characterized in that the correction circuit comprises N accumulator circuits, wherein the first of said N accumulator circuits is adapted to receive said signal representing a remainder, and each of the remaining N accumulator circuits after the first is adapted to receive a remainder of the preceding accumulator circuit in the correction circuit and each of the N accumulator circuits is connected to a second adder circuit via a plurality of difference determining circuits equal to an order number of the accumulator circuit in the correction circuit minus 1.

4. Circuit as claimed in claim 3, characterized in that a divider circuit is arranged between the second controlled oscillator and the phase detector.

5. Circuit as claimed in claim 4, characterized by a cascade circuit of combinations of at least two of said first controlled oscillator and at least two of said phase-locked loop.

6. Circuit as claimed in claim 1, characterized in that the correction circuit is connected to at least one delay circuit incorporated in the PLL.

7. Circuit as claimed in claim 6, characterized in that at least one divider is arranged between the second controlled oscillator and the delay circuit and that the output terminal of the divider is directly connected to a clock terminal of the delay circuit.

8. Circuit as claimed in claim 7, characterized in that at least one modulo divider is arranged at the output terminal of the accumulator circuit and that a carry signal of the modulo divider is also fed to the correction circuit.

9. Circuit as claimed in claim 8, characterized in that the output terminal of the modulo divider is connected to a second second modulo divider and that the carry output signal of the modulo divider is fed to the phase detector of the PLL.

10. The circuit as claimed in claim 1, characterized in that a divider circuit is arranged between the second controlled oscillator and the phase detector.

11. The circuit as claimed in claim 1, characterized by a cascade circuit of combinations of at least two of said first controlled oscillator and at least two of said phase-locked loop.

12. Circuit for frequency synthesis, comprising:

a first controlled oscillator which is digitally controlled and adapted to generate a signal representing a remainder, comprising:

a clock generator;

an accumulator circuit to which a signal from the clock generator is fed; and a control digit feed circuit for feeding to the accumulator circuit a signal representing a control digit;

a phase-locked loop which is connected, via one or more delay circuits, to a carry output terminal of the accumulator circuit and which is provided with a phase detector, a low-pass filter incorporated in the phase-locked loop after the phase detector, and a second controlled oscillator incorporated in the phase-locked loop after the low-pass filter and before the phase detector, wherein the carry output terminal is connected to the phase detector via said one or more delay circuits; and a correction circuit for deriving a correction signal from the signal representing a remainder, comprising:

N accumulator circuits, wherein the first of said N accumulator circuits is adapted to receive said signal representing a remainder, and each of the N accumulator circuits after the first is adapted to receive a remainder of the preceding accumulator circuit in the correction circuit, and each of the N accumulator circuits is connected to an adder circuit via a plurality of difference determining circuits equal to an order number of the accumulator circuit in the correction circuit minus 1; and a D/A converter connected to an output of said adder circuit;

characterized in that an output terminal of the D/A converter of said correction circuit is connected to a second adder circuit (14a) incorporated in the PLL after the phase detector.

* * * * *

UNITED STATES PATENT AND TRADEMARK OFFICE
CERTIFICATE OF CORRECTION

PATENT NO. : 5,905,388
DATED : May 18, 1999
INVENTOR(S) : Robertus L. Van Der Valk et al.

It is certified that error appears in the above-identified patent and that said Letters Patent is hereby corrected as shown below:

Title page,
Item [75], correct the spelling of the second inventor's name to read:

Robert J. Deguesnoy

Signed and Sealed this

Twenty-first Day of August, 2001

*Attest:*

*Attesting Officer*

NICHOLAS P. GODICI
*Acting Director of the United States Patent and Trademark Office*